United States Patent
Kuno et al.

(10) Patent No.: US 8,050,064 B2
(45) Date of Patent: Nov. 1, 2011

(54) SEMICONDUCTOR POWER CONVERSION DEVICE

(75) Inventors: Hiromichi Kuno, Nishikamo-gun (JP); Satoshi Hirose, Nishikamo-gun (JP); Naoyoshi Takamatsu, Susono (JP); Hiroya Tsuji, Yokkaichi (JP); Hiroyuki Sakakibara, Hekinan (JP); Kazuki Fukatsu, Anjo (JP)

(73) Assignees: Toyota Jidosha Kabushiki Kaisha, Aichi-Ken (JP); Denso Corporation, Aichi-Ken (JP); Nippon Soken, Inc., Aichi-Ken (JP)

( * ) Notice: Subject to any disclaimer, the term of this patent is extended or adjusted under 35 U.S.C. 154(b) by 288 days.

(21) Appl. No.: 12/525,169

(22) PCT Filed: Feb. 13, 2008

(86) PCT No.: PCT/JP2008/052791
§ 371 (c)(1), (2), (4) Date: Jul. 30, 2009

(87) PCT Pub. No.: WO2008/099959
PCT Pub. Date: Aug. 21, 2008

(65) Prior Publication Data
US 2010/0008113 A1 Jan. 14, 2010

(30) Foreign Application Priority Data
Feb. 14, 2007 (JP) ................. 2007-033606

(51) Int. Cl.
*H02H 7/122* (2006.01)
*G05F 1/40* (2006.01)
(52) U.S. Cl. ............ 363/56.05; 363/98; 323/271
(58) Field of Classification Search .......... 363/39–41, 363/56.02–56.05, 98, 132; 323/271, 907
See application file for complete search history.

(56) References Cited

U.S. PATENT DOCUMENTS

| | | | |
|---|---|---|---|
| 5,926,012 A | 7/1999 | Takizawa et al. | |
| 6,242,968 B1 | 6/2001 | Sakai et al. | |
| 6,275,399 B1 * | 8/2001 | Miyazaki et al. | 363/98 |
| 6,392,908 B2 * | 5/2002 | Miyazaki et al. | 363/98 |
| 6,490,182 B2 * | 12/2002 | Katoh et al. | 363/56.05 |
| 6,680,835 B2 * | 1/2004 | Tabata | 361/79 |

FOREIGN PATENT DOCUMENTS

| | | |
|---|---|---|
| JP | 08-322240 A | 12/1996 |
| JP | 10-150764 A | 6/1998 |
| JP | 2001-136732 A | 5/2001 |
| JP | 2001-238431 A | 8/2001 |
| JP | 2006-129643 A | 5/2006 |
| JP | 2007-089325 A | 4/2007 |

OTHER PUBLICATIONS

Kosei Tsuji, et al., "Propagation of Inverter Surge and Voltage Distribution in Motor Winding," IEEJ Trans. IA, 2006, pp. 771-777, vol. 126, No. 6.

* cited by examiner

Primary Examiner — Jessica Han
(74) Attorney, Agent, or Firm — Sughrue Mion, PLLC

(57) ABSTRACT

A surge voltage target setting unit obtains a main circuit power supply voltage of a semiconductor power conversion device based on an inter-terminal voltage of a semiconductor switching element detected by a voltage detection unit, and sets a control target of a surge voltage in accordance with the obtained main circuit power supply voltage. An active gate control unit, when the semiconductor switching element is turned off, sets a quantity of voltage modification so as to modify a gate voltage in a direction raising the gate voltage, that is, in a direction lowering a turn-off speed, based on feedback of the inter-terminal voltage, when the inter-terminal voltage exceeds the control target.

15 Claims, 10 Drawing Sheets

|dVce/dt| OF
SEMICONDUCTOR
SWITCHING ELEMENT

ELEMENT TEMPERATURE

Gp, Gd

ELEMENT TEMPERATURE

SEMICONDUCTOR POWER CONVERSION DEVICE

TECHNICAL FIELD

The present invention relates to a semiconductor power conversion device, and more particularly to active gate control for suppressing voltage fluctuation that takes place at the time of turn-on and/or turn-off of a semiconductor switching element implementing a semiconductor power conversion device such as an inverter or a converter.

BACKGROUND ART

For a semiconductor switching element implementing a semiconductor power conversion device such as an inverter or a converter, active gate control for dynamically controlling a gate voltage is employed as a technique for suppressing a peak voltage in a switching operation without requiring a snubber circuit.

For example, Japanese Patent Laying-Open No. 2001-136732 (hereinafter, Patent Document 1) discloses a semiconductor power conversion device including voltage application means for applying forward bias and reverse bias to a gate to set an emitter of a semiconductor switching element to an intermediate potential and voltage division means for dividing a collector-emitter voltage, in which a gate voltage is controlled in accordance with a voltage across the collector and the emitter when the collector-emitter voltage is equal to or greater than a voltage determined by the voltage division means while a drive signal is OFF.

According to the semiconductor power conversion device disclosed in Patent Document 1, gate voltage control, that is, active gate control, can be carried out such that feedback of a surge voltage is provided to lower the surge voltage, by dynamically controlling the gate voltage based on the divided collector-emitter voltage while the semiconductor switching element is OFF.

In addition, Japanese Patent Laying-Open No. 2001-238431 (hereinafter, Patent Document 2) discloses a semiconductor power conversion device configured to include a semiconductor switching element for power conversion connected to each arm connecting a DC power supply and a load to each other, that is, an IGBT (Insulated Gate Bipolar Transistor) having a collector and an emitter connected in series to the arm, a capacitor connected between the collector and a gate of this IGBT and supplying a current adapted to a rate of variation of the collector-emitter voltage to the gate, and an auxiliary DC power supply connected in parallel to the capacitor through a buffer diode. In addition, a configuration for supplying a current to the gate through the capacitor when a voltage obtained by adding decrease in a forward voltage of the buffer diode to a voltage of the capacitor on the collector side exceeds an output voltage of the auxiliary DC power supply is shown.

According to the semiconductor power conversion device disclosed in Patent Document 2, when a collector voltage exceeds a prescribed voltage obtained by charging the capacitor with the auxiliary DC power supply, feedback is activated so that the gate voltage can be varied to lower a surge voltage. Thus, active gate control can be carried out so as to lower the surge voltage.

In general, in an inverter included in an air-conditioner or a hybrid vehicle, control for dynamically varying a main circuit power supply voltage converted by the inverter (semiconductor power conversion device) depending on a drive condition of a motor driven and controlled by the inverter is carried out.

On the other hand, in conventional active gate control represented by Patent Documents 1 and 2, whether or not a gate voltage is to be varied to suppress a surge voltage is determined based on comparison between a collector voltage of a semiconductor switching element and a prescribed fixed voltage. Namely, a set voltage at which active gate control is activated is fixed.

Therefore, if the set voltage above is determined in accordance with a maximum value of the main circuit power supply voltage as designed, active gate control can be exerted such that a withstand voltage of the semiconductor switching element is not exceeded. On the other hand, if the main circuit power supply voltage is controlled to a low voltage, suppression of surge through active gate control cannot effectively be achieved. In such a case, a feedback amount through active gate control decreases and a switching operation of the semiconductor switching element becomes a simple operation of simply alternately applying a forward bias voltage (voltage for turn-on) and a reverse bias voltage (voltage for turn-off) to the gate, which results in failure in suppression of voltage variation involved with turn-on and turn-off. Consequently, free oscillation voltage variation may take place due to a parasitic capacitance of the semiconductor switching element and a parasitic inductance of a main circuit, and such an oscillation voltage causes EMI (electro-magnetic interference) represented by electromagnetic noise.

In addition, as pointed out in general, where the motor is driven and controlled by the inverter, dielectric breakdown due to partial discharge between windings inside the motor is more likely when voltage fluctuation (dv/dt) of an output voltage from the inverter is excessive. In order to prevent this, it is important to suppress dv/dt within a prescribed range. Here, as described above, suppression of dv/dt is important also from a point of view of measures against EMI.

In active gate control in the semiconductor power conversion device disclosed in Patent Documents 1 and 2, however, a condition of a voltage at which active gate control is activated is determined based on comparison between a collector voltage and a prescribed voltage (set voltage). Accordingly, it is not easy to carry out active gate control so as to strictly restrict dv/dt of a collector-emitter voltage of the semiconductor switching element implementing the inverter. Consequently, it has been difficult to reliably suppress dv/dt of the output voltage from the inverter, that is, a voltage across terminals of the motor, within a prescribed range.

DISCLOSURE OF THE INVENTION

The present invention was made to solve the above-described problems, and an object of the present invention is to provide a semiconductor power conversion device capable of effectively carrying out active gate control in accordance with variation of a main circuit power supply voltage or such that variation of a voltage (dv/dt) across output terminals of a semiconductor switching element is reliably suppressed within a prescribed range.

A semiconductor power conversion device according to the present invention is a semiconductor power conversion device converting a variably controlled main circuit power supply voltage, and includes a semiconductor switching element, a drive control unit, and a drive circuit. The semiconductor switching element is configured to control a current between first and second electrodes in response to a voltage or current of a control electrode. The drive control unit is configured to set a control voltage within a range from a first voltage for rendering the semiconductor switching element conducting to a second voltage for disconnecting the semiconductor switching element, in accordance with a control signal indicating turn-on and turn-off of the semiconductor switching element. The drive circuit is configured to drive the voltage or current of the control electrode in accordance with the control voltage set by the drive control unit. The drive control unit includes a voltage detection unit for detecting an inter-electrode voltage across the first and second electrodes, a surge control target setting unit for variably setting in accordance with the main circuit power supply voltage, a control target of a surge voltage generated across the first and second electrodes when the semiconductor switching element is turned off, and a first active gate control unit. The first active gate control unit is configured to modify the control voltage toward the first voltage by a quantity of voltage modification based on the inter-electrode voltage, when the inter-electrode voltage detected by the voltage detection unit exceeds the control target.

According to the semiconductor power conversion device above, active gate control for modifying the control voltage at the time of turn-off of the semiconductor switching element from the second voltage toward the first voltage can be activated when the inter-electrode voltage (inter-terminal voltage) exceeds the control target of the surge voltage variably set in accordance with the main circuit power supply voltage. Therefore, by appropriately carrying out active gate control in correspondence with variation of the main circuit power supply voltage, generation of an excessive surge voltage and sudden voltage variation (dv/dt) in the semiconductor switching element can be suppressed. Consequently, breakdown of an element and generation of electromagnetic noise can be prevented.

Preferably, the first active gate control unit performs control operation based on deviation of the inter-electrode voltage from the control target, and sets the quantity of voltage modification in accordance with a control operation result when the control operation result indicates a positive value, whereas sets the quantity of voltage modification to substantially zero when the control operation result indicates a negative value.

According to such a configuration, active gate control for turn-on of the semiconductor switching element can be carried out with an appropriate quantity of voltage modification based on deviation of the inter-terminal voltage from the control target of the surge voltage, so as to avoid increase in switching power loss due to variation of the inter-terminal voltage that is unduly made gentle when the semiconductor switching element is turned on.

Further preferably, the first active gate control unit performs the control operation under proportional-derivative control.

According to such a configuration, active gate control can be started at an early stage in correspondence with increase in the inter-terminal voltage of the semiconductor switching element, that is, generation of a surge voltage, under proportional-derivative control.

In addition, preferably, the surge control target setting unit sets the control target based on a voltage detected by the voltage detection unit in a period during which the semiconductor switching element is turned off and is electrically connected between power supply lines to which the main circuit power supply voltage is applied.

According to such a configuration, the control target of the surge voltage can appropriately be set in correspondence with variation of the main circuit power supply voltage based on detection of the inter-terminal voltage of the semiconductor switching element, with inexpensive circuitry not requiring isolation from the outside of the drive control unit in transmitting information on the main circuit power supply voltage.

Preferably, the drive control unit is configured to further include a voltage increase rate control target setting unit, a second active gate control unit, and an adjustment unit. The voltage increase rate control target setting unit sets a control target of a voltage increase rate representing a time-derivative value in increase in the inter-electrode voltage. The second active gate control unit modifies the control voltage toward the first voltage by a quantity of voltage modification in accordance with deviation of the voltage increase rate from the control target based on the inter-electrode voltage detected by the voltage detection unit, when the voltage increase rate exceeds the control target. The adjustment unit is configured to modify the control voltage toward the first voltage by a larger voltage quantity out of the quantities of voltage modification by the first and the second active gate control units.

Configured as such, when the voltage increase rate of the inter-terminal voltage of the semiconductor switching element exceeds the control target set in advance, active gate control can be carried out in a direction suppressing voltage increase. Therefore, active gate control for turn-off of the semiconductor switching element can be carried out such that increase in the surge voltage in correspondence with the main circuit power supply voltage is prevented and the voltage variation rate (increase rate) is within a prescribed range.

Further preferably, the drive control unit is configured to further include a voltage lowering rate control target setting unit and a third active gate control unit. The voltage lowering rate control target setting unit sets a control target of a voltage lowering rate representing a time-derivative value in lowering in the inter-electrode voltage. The third active gate control unit modifies the control voltage toward the second voltage by a quantity of voltage modification in accordance with deviation of the voltage lowering rate from the control target based on the inter-electrode voltage detected by the voltage detection unit, when the voltage lowering rate exceeds the control target.

Configured as such, when the voltage lowering rate of the inter-terminal voltage of the semiconductor switching element exceeds the control target set in advance, active gate control can be carried out in a direction suppressing voltage lowering. Therefore, active gate control can be carried out also when the semiconductor switching element is turned on such that the voltage variation rate (lowering rate) is within a prescribed range.

Particularly according to such a configuration, the drive control unit further includes a selection unit for selectively activating one of the second and the third active gate control units in accordance with the control signal. Preferably, the selection unit activates the second active gate control unit when the semiconductor switching element is turned off, and the selection unit activates the third active gate control unit when the semiconductor switching element is turned on.

Configured as such, active gate control is carried out when the semiconductor switching element is turned off such that the voltage increase rate of the inter-terminal voltage does not exceed the control target, while active gate control can be carried out when the semiconductor switching element is turned on such that the voltage lowering rate of the inter-terminal voltage does not exceed a prescribed control target. Consequently, voltage variation (dv/dt) at the time of turn-on and turn-off can reliably be suppressed within a prescribed range without uselessly increasing switching power loss of the semiconductor switching element.

Preferably, the drive control unit is configured to further include a voltage lowering rate control target setting unit and a third active gate control unit. The voltage lowering rate control target setting unit sets a control target of a voltage lowering rate representing a time-derivative value in lowering in the inter-electrode voltage. The third active gate control unit modifies the control voltage toward the second voltage by a quantity of voltage modification in accordance with deviation of the voltage lowering rate from the control target based on the inter-electrode voltage detected by the voltage detection unit, when the voltage lowering rate exceeds the control target.

Configured as such, when the voltage lowering rate of the inter-terminal voltage of the semiconductor switching element exceeds the control target set in advance, active gate control can be carried out in a direction suppressing voltage lowering. Therefore, active gate control can be carried out when the semiconductor switching element is turned on such that the voltage variation rate (lowering rate) is reliably within a prescribed range.

Further preferably, the voltage increase rate control target setting unit or the voltage lowering rate control target setting unit variably sets the control target based on at least one of a temperature, an air pressure and a relative humidity of a motor driven and controlled by the semiconductor power conversion device.

According to such a configuration, a range within which the voltage increase rate and/or the voltage lowering rate of the inter-terminal voltage of the semiconductor switching element is limited can variably be set based on at least one of the temperature, the air pressure and the humidity (relative humidity) of the motor serving as a load. Thus, by making the range above stricter when the motor is in an environment where partial discharge is likely and otherwise relaxing the range above, occurrence of dielectric breakdown due to partial discharge in the motor can be prevented without unduly increasing switching power loss in the semiconductor switching element.

In addition, preferably, the semiconductor power conversion device further includes a temperature detection unit and a control parameter changing unit. The temperature detection unit detects a temperature of the semiconductor switching element. The control parameter changing unit is configured to variably set a control parameter used for control operation for calculating the quantity of voltage modification of the control voltage in at least one of the first to the third active gate control units, in accordance with an element temperature detected by the temperature detection unit.

According to such a configuration, reflecting such a characteristic that response of the semiconductor switching element deteriorates with increase in the temperature, the quantity of voltage modification in active gate control can relatively be great in a low temperature state where a voltage variation speed is greater under the same condition. Consequently, reflecting the temperature characteristic of the semiconductor switching element, occurrence of excessive voltage variation when the temperature is low is suppressed and increase in switching loss when the temperature is high can be suppressed.

A semiconductor power conversion device according to another aspect of the present invention includes a semiconductor switching element, a drive control unit, and a drive circuit. The semiconductor switching element is configured to control a current between first and second electrodes in response to a voltage or current of a control electrode. The drive control unit is configured to set a control voltage within a range from a first voltage for rendering the semiconductor switching element conducting to a second voltage for disconnecting the semiconductor switching element, in accordance with a control signal indicating turn-on and turn-off of the semiconductor switching element. The drive circuit is configured to drive the voltage or current of the control electrode in accordance with the control voltage set by the drive control unit. The drive control unit includes a voltage detection unit for detecting an inter-electrode voltage across the first and second electrodes, a voltage variation rate control target setting unit for setting a control target of a voltage variation rate representing a time-derivative value in variation of the inter-electrode voltage, and an active gate control unit. The active gate control unit is configured to modify the control voltage in a direction preventing variation of the present inter-electrode voltage based on the inter-electrode voltage detected by the voltage detection unit, when the voltage variation rate exceeds the control target.

According to the semiconductor power conversion device above, when the voltage variation rate of the inter-electrode voltage (the collector-emitter voltage) of the semiconductor switching element exceeds the control target set in advance, active gate control can be carried out in a direction suppressing voltage variation. Therefore, active gate control can be carried out such that the voltage variation rate when the semiconductor switching element is turned on and turned off is within a prescribed range.

Preferably, the voltage variation rate control target setting unit sets a control target of a voltage increase rate representing a time-derivative value in increase in the inter-electrode voltage, and the active gate control unit, at turn-off of the semiconductor switching element, modifies the control voltage from the second voltage toward the first voltage based on the inter-electrode voltage detected by the voltage detection unit, when the voltage increase rate exceeds the control target.

Configured as such, when the semiconductor switching element is turned off, active gate control is carried out such that the voltage increase rate of the inter-terminal voltage does not exceed the control target, whereas such control as suppressing the voltage lowering rate is not carried out. Therefore, the voltage variation rate (dv/dt) at turn-off of the semiconductor switching element can reliably be suppressed within a prescribed range, without uselessly increasing switching power loss.

In addition, preferably, the voltage variation rate control target setting unit sets a control target of a voltage lowering rate representing a time-derivative value in lowering in the inter-electrode voltage, and the active gate control unit, at turn-on of the semiconductor switching element, modifies the control voltage from the first voltage toward the second voltage based on the inter-electrode voltage detected by the voltage detection unit, when the voltage lowering rate exceeds the control target.

Configured as such, when the semiconductor switching element is turned on, active gate control is carried out such that the voltage lowering rate of the inter-terminal voltage does not exceed the control target, while such control as suppressing the voltage increase rate is not carried out. Therefore, the voltage variation rate (dv/dt) when the semiconductor switching element is turned on can reliably be suppressed within a prescribed range, without uselessly increasing switching power loss.

Further preferably, the voltage variation rate control target setting unit variably sets the control target based on at least one of a temperature, an air pressure and a relative humidity of a motor driven and controlled by the semiconductor power conversion device.

According to such a configuration, a range within which the voltage variation rate of the inter-terminal voltage of the semiconductor switching element is limited can variably be set based on at least one of the temperature, the air pressure and the humidity (relative humidity) of the motor serving as a load. Thus, by making the range above stricter when partial discharge in the motor is likely and otherwise relaxing the range above, occurrence of dielectric breakdown due to partial discharge in the motor can be prevented, without unduly increasing switching power loss in the semiconductor switching element.

In addition, preferably, the semiconductor power conversion device further includes a temperature detection unit and a control parameter changing unit. The temperature detection unit detects a temperature of the semiconductor switching element. The control parameter changing unit is configured to variably set a control parameter used for control operation for calculating a quantity of voltage modification of the control voltage in the active gate control unit, in accordance with an element temperature detected by the temperature detection unit.

According to such a configuration, reflecting such a characteristic that response of the semiconductor switching element deteriorates with increase in the temperature, the quantity of voltage modification by active gate control can relatively be great in a low temperature state where a voltage variation speed is greater under the same condition. Consequently, reflecting the temperature characteristic of the semiconductor switching element, occurrence of excessive voltage variation when the temperature is low is suppressed and increase in switching loss when the temperature is high can be suppressed.

Therefore, a primary advantage of the present invention is that voltage variation when the semiconductor switching element is turned on and turned off can be suppressed by effectively carrying out active gate control in accordance with variation of the main circuit power supply voltage or such that voltage variation (dv/dt) across output terminals of the semiconductor switching element is reliably suppressed within a prescribed range in the semiconductor power conversion device.

BEST MODES FOR CARRYING OUT THE INVENTION

Figure 1:
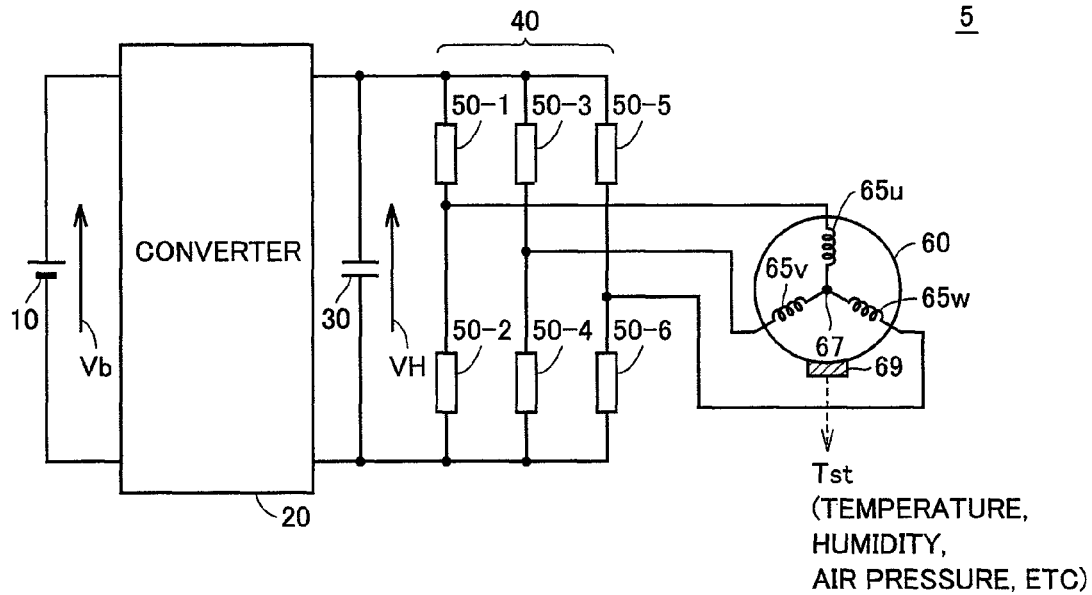
FIG. 1 is a circuit diagram showing an exemplary configuration of a semiconductor power conversion device according to a first embodiment of the present invention.

An embodiment of the present invention will be described hereinafter in detail with reference to the drawings. In the following, the same or corresponding elements in the drawings have the same reference characters allotted, and in principle, description thereof will not be repeated.

First Embodiment

FIG. 1 is a circuit diagram showing an exemplary configuration of a semiconductor power conversion device according to an embodiment of the present invention.

Referring to FIG. 1, a power conversion system 5 includes a DC power supply 10, a converter 20, a smoothing capacitor 30, an inverter 40 shown as a representative example of the semiconductor power conversion device according to the embodiment of the present invention, and a motor 60 driven and controlled by inverter 40.

DC power supply 10 outputs a DC voltage Vb. Converter 20 has a DC voltage conversion function and converts output voltage Vb from DC power supply 10 to output a DC voltage VH. The output voltage from converter 20 is smoothened by smoothing capacitor 30.

Inverter 40 has six arms 50-1 to 50-6 implementing upper and lower arms of three phases. As will be described later in detail, each arm 50 (collective denotation of arms 50-1 to 50-6; to be understood similarly hereinafter) has a semiconductor switching element.

Motor 60 has a stator (not shown) around which three-phase coil windings 65$u$, 65$v$, 65$w$ are wound and a rotor (not shown). One ends of coil windings 65$u$, 65$v$, 65$w$ of respective phases are electrically connected at a neutral point 67 and the other ends thereof are connected to points of connection to upper and lower arms of U-phase, V-phase, and W-phase, respectively.

Motor 60 is provided with various sensors 69 obtaining various measurement values Tst indicating states of the motor. Motor measurement values Tst include a current (each phase), an angle of rotation of the rotor, and the like necessary for controlling the motor, as well as a temperature, a humidity (representatively a relative humidity), an air pressure, and the like indicating an operation environment of the motor.

Inverter 40 converts DC voltage VH serving as a main circuit power supply voltage variably controlled by converter 20 to an AC voltage for driving and controlling motor 60.

Figure 2:
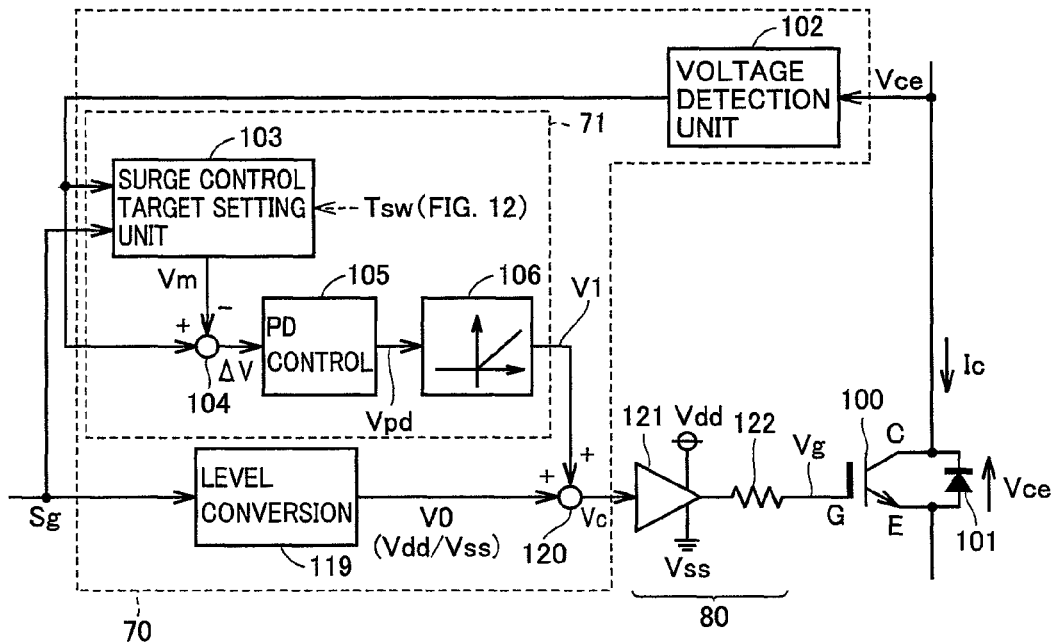
FIG. 2 is a block diagram illustrating a switching control configuration of each arm in the semiconductor power conversion device according to the first embodiment.

FIG. 2 is a block diagram illustrating a switching control configuration of each arm in the semiconductor power conversion device according to the first embodiment.

Referring to FIG. 2, each arm is configured to include a semiconductor switching element 100, an anti-parallel diode 101, a drive control unit 70, and a drive circuit 80. In the present embodiment, it is assumed that semiconductor switching element 100 is implemented by an IGBT as a representative example. Therefore, a current between the collector and the emitter, including turn-on and turn-off of semiconductor switching element 100, is controlled in response to a gate voltage Vg.

Drive control unit 70 includes a voltage detection unit 102, an active gate control unit 71, a level conversion unit 119, and a voltage addition unit 120. Active gate control unit 71 includes a surge control target setting unit 103, a voltage operation unit 104, a PD control unit 105, and a rectifier unit 106. Drive circuit 80 includes a buffer circuit 121 and a gate resistor 122.

Semiconductor switching element 100 is a switching element switched on and off in response to a gate control signal Sg, and in particular when it is turned off, due to a parasitic inductance within a main circuit, semiconductor switching element 100 generates a surge voltage across terminals, that is, across the collector and the emitter in the example in FIG. 2, in response to sudden cut-off of the current caused by hard switching. Hereinafter, a collector-emitter voltage Vce is also simply referred to as an inter-terminal voltage Vce.

Voltage detection unit 102 detects inter-terminal voltage Vce of semiconductor switching element 100 and generates a voltage signal in accordance with Vce. Depending on a configuration of active gate control unit 71 in a subsequent stage, an output signal from voltage detection unit 102 is either an analog signal or a digital signal. In other words, each component in active gate control unit 71 may be configured with any of hardware (including processing of an analog signal and processing of a digital signal of a plurality of bits; to be understood similarly hereinafter) and software.

If active gate control unit 71 is configured with an analog circuit, voltage detection unit 102 is configured with a voltage-divider based on resistance division, a differential amplifier circuit and the like, and it outputs an analog voltage in proportion to inter-terminal voltage Vce. Regarding the voltage-divider, in addition to the configuration based on simple resistance division, the voltage-divider may be configured with an RC network having an excellent frequency characteristic in consideration of a parasitic capacitance. In addition, common-mode noise can be lowered with the use of a differential amplifier circuit.

On the other hand, if active gate control unit 71 is configured with a digital circuit or software, voltage detection unit 102 is configured with the voltage-divider, the differential amplifier circuit and the like above as well as an analog/digital converter, and it outputs a digital signal of a plurality of bits representing inter-terminal voltage Vce. The output signal from voltage detection unit 102 is also hereinafter denoted as inter-terminal voltage Vce.

Surge control target setting unit 103 obtains inter-terminal voltage Vce of semiconductor switching element 100 detected by voltage detection unit 102 and main circuit power supply voltage VH based on gate control signal Sg, and sets a control target Vm of the surge voltage in accordance with main circuit power supply voltage VH. Specifically, surge control target setting unit 103 sets control target Vm such that inter-terminal voltage Vce does not exceed a withstand voltage of semiconductor switching element 100 in correspondence with a maximum value of main circuit power supply voltage VH as designed, and also lowers control target Vm when main circuit power supply voltage VH is lowered. A configuration for obtaining main circuit power supply voltage VH in surge control target setting unit 103 will be described in detail later.

Voltage operation unit 104 calculates deviation ΔV of collector-emitter voltage Vce detected by voltage detection unit 102 from control target Vm of the surge voltage set by surge control target setting unit 103 (ΔV=Vce−Vm).

PD control unit 105 generates a control operation voltage Vpd through proportional-derivative (PD) control operation of deviation ΔV calculated by voltage operation unit 104. Namely, control operation in PD control unit 105 is specifically shown in Equation (1) below. In Equation (1), Gp and Gd represent control gain.

$$Vpd = Gp \cdot \Delta V + Gd \cdot d\Delta V/dt \qquad (1)$$

Rectifier unit 106 calculates a quantity of voltage modification V1 by allowing passage of only a positive value of control operation voltage Vpd from PD control unit 105. Namely, when relation of Vpd>0 is satisfied, setting as V1=Vpd is made. On the other hand, when relation of Vpd≦0 is satisfied, setting as V1=0 is made. Thus, quantity of voltage modification V1 by active gate control unit 71 is set only in a direction increasing gate voltage Vg of semiconductor switching element 100, that is, a direction preventing turn-off of semiconductor switching element 100.

Level conversion unit 119 converts a voltage of gate control signal Sg which is a digital signal indicating turn-on and turn-off of semiconductor switching element 100 to generate a gate control voltage V0. Gate control voltage V0 is set to a voltage Vdd for turn-on for rendering semiconductor switching element 100 conducting when turn-on of semiconductor switching element 100 is indicated, while it is set to a voltage Vss for turn-off (Vdd>Vss) for disconnecting semiconductor switching element 100 when turn-off of semiconductor switching element 100 is indicated.

Voltage addition unit 120 generates control voltage Vc in accordance with the sum of gate control voltage V0 output from level conversion unit 119 and quantity of voltage modification V1 by active gate control unit 71.

Buffer circuit 121 is implemented by a power amplifier circuit such as an emitter follower outputting gate voltage Vg corresponding to input control voltage Vc with low impedance. Namely, in the present embodiment, Vg=Vc and the gate voltage of semiconductor switching element 100 is controlled based on control voltage Vc.

An operation in active gate control in the semiconductor power conversion device according to the first embodiment will be described with reference to FIG. 3.

Figure 3:
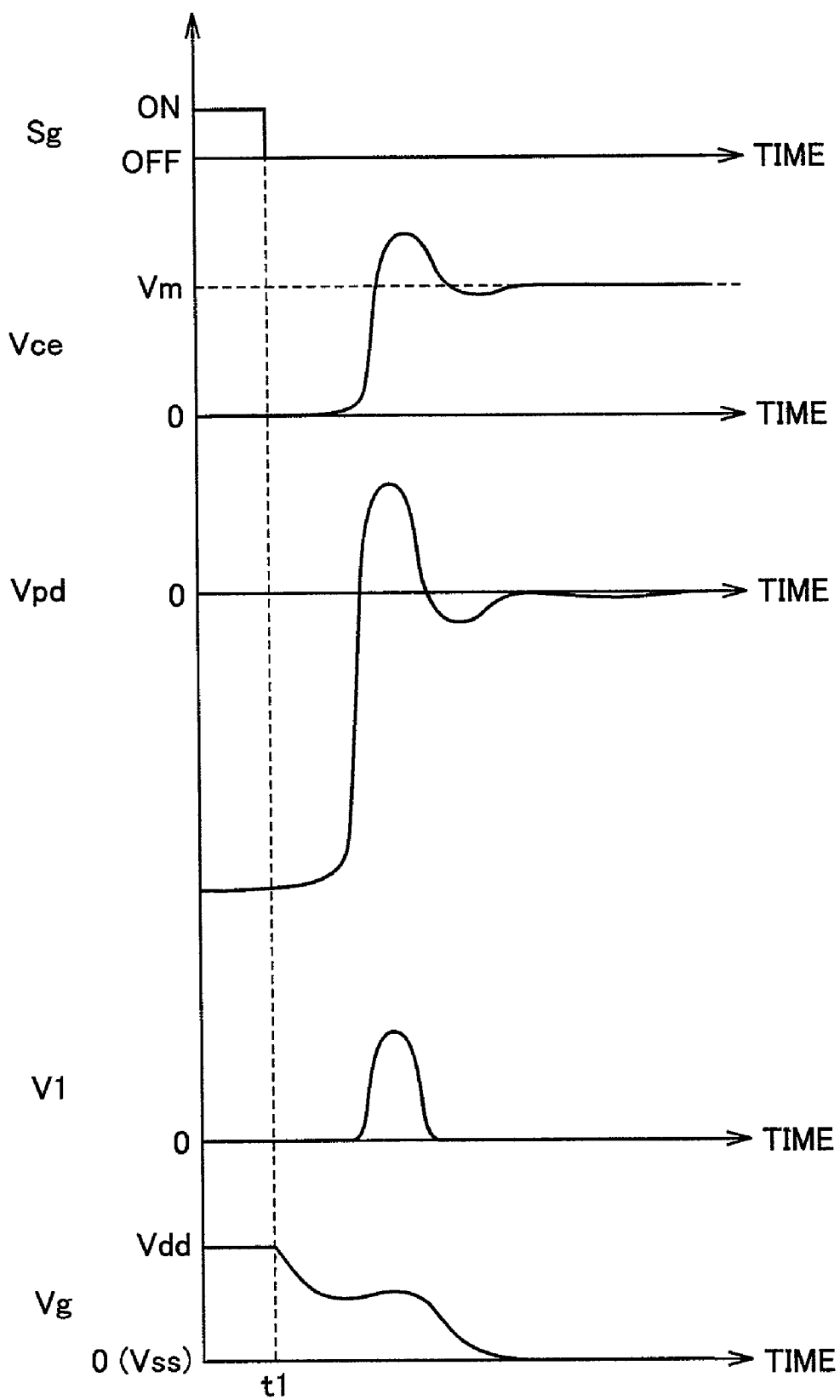
FIG. 3 is a waveform diagram illustrating an operation in active gate control in the semiconductor power conversion device according to the first embodiment.

Referring to FIG. 3, at the time of turn-off (time t1) when gate control signal Sg makes transition from the ON level to the OFF level, gate voltage Vg starts to lower with gate control voltage V0 (FIG. 2) being set to voltage Vss for turn-off.

With turn-off of semiconductor switching element 100 in response to gate control signal Sg, inter-terminal voltage Vce starts to increase. Control operation voltage Vpd has a value obtained by multiplying deviation ΔV=Vm by control gain Gp (−Gp·Vm) at the time of start of turn-off (time t1), however, it increases with the increase in inter-terminal voltage Vce. Then, when inter-terminal voltage Vce has a value in the vicinity of control target Vm, relation of Vpd>0 is satisfied. In particular, by combining derivative control, relation of Vpd>0 can be satisfied before inter-terminal voltage Vce exceeds a control target value m.

When relation of control operation voltage Vpd>0 is satisfied, quantity of voltage modification V1 output from rectifier unit 106 is set to Vpd and control voltage Vc is modified from voltage Vss for turn-off. Therefore, active gate control for modifying gate voltage Vg in a direction increasing gate voltage Vg, that is, in a direction lowering a turn-off speed, is started.

As gate voltage Vg increases through active gate control, inter-terminal voltage Vce lowers. Accordingly, as control operation voltage Vpd also lowers, quantity of voltage modification V1 output from rectifier unit 106 again attains to 0 and gate voltage Vg lowers toward voltage Vss for turn-off.

Consequently, when semiconductor switching element 100 is turned off, active gate control based on feedback of inter-terminal voltage Vce can be carried out such that inter-terminal voltage Vce is suppressed around control target Vm set in accordance with main circuit power supply voltage VH.

Thus, the surge voltage when semiconductor switching element 100 is turned off can be controlled to control target Vm set in correspondence with main circuit power supply voltage VH. In addition, even when main circuit power supply voltage VH is changed, control target Vm can immediately be changed by surge control target setting unit 103. Therefore, as compared with an example where the control target value is set in a fixed manner, occurrence of surge or voltage oscillation in inter-terminal voltage Vce can be prevented by appropriately activating active gate control in particular in a low range of the main circuit power supply voltage.

In addition, by providing rectifier unit 106, during a period in which inter-terminal voltage Vce (surge voltage) has not yet reached control target Vm, gate voltage Vg can rapidly be varied toward voltage Vss for turn-off by buffer circuit 121, without exerting feedback control. By thus carrying out active gate control, switching power loss (turn-off loss) can be prevented from unduly increasing.

A configuration for surge control target setting unit 103 to obtain main circuit power supply voltage VH will now be described.

Figure 4:
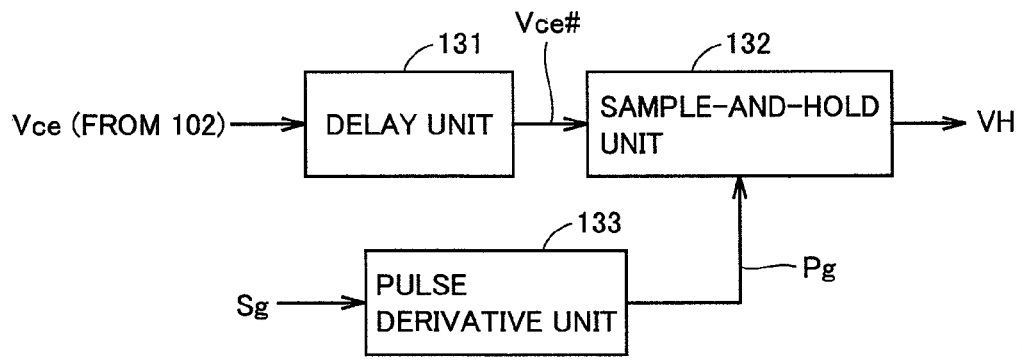
FIG. 4 is a block diagram showing an exemplary configuration of a voltage detection unit shown in FIG. 2.

FIG. 4 is a block diagram showing a configuration for obtaining main circuit power supply voltage VH in surge control target setting unit 103 shown in FIG. 2.

Referring to FIG. 4, surge control target setting unit 103 has a delay unit 131, a sample-and-hold unit 132, and a pulse derivative unit 133.

Delay unit 131 outputs Vce# obtained by delaying inter-terminal voltage Vce detected by voltage detection unit 102 by a prescribed period of time. Pulse derivative unit 133 outputs a pulse Pg based on gate control signal Sg when a turn-on instruction of semiconductor switching element 100 is generated, that is, at the time point when gate control signal Sg makes transition from the off level to the on level.

Sample-and-hold unit 132 obtains main circuit power supply voltage VH by sampling delayed inter-terminal voltage Vce# when pulse Pg is generated by pulse derivative unit 133.

Figure 5:
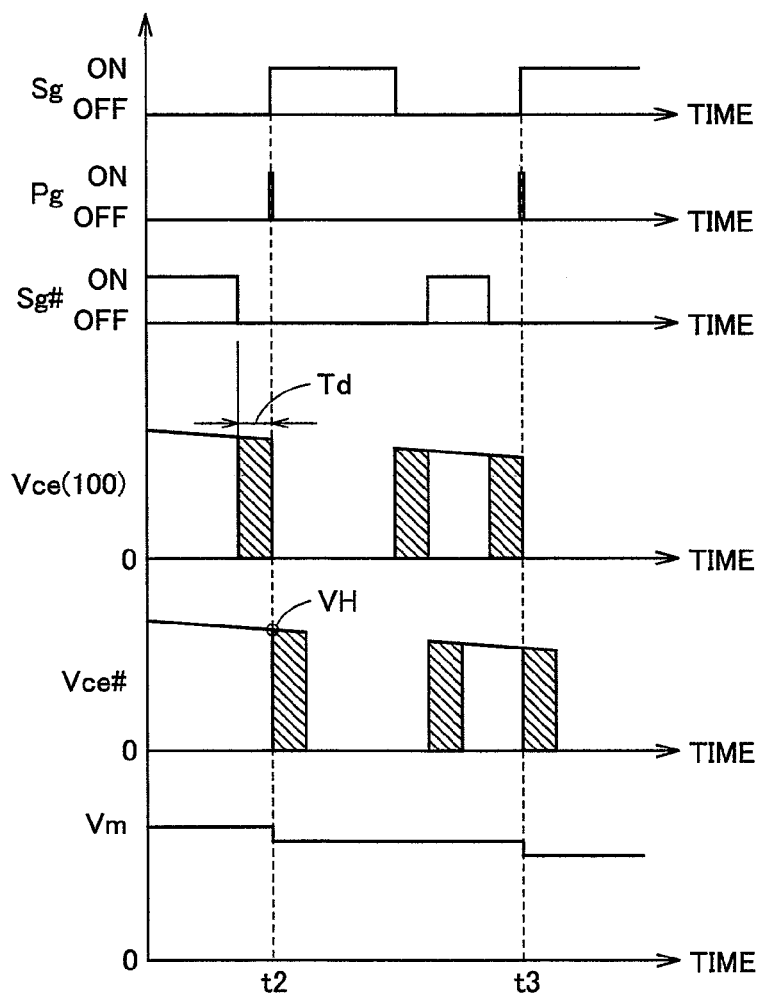
FIG. 5 is a waveform diagram illustrating an operation of the voltage detection unit shown in FIG. 4.

FIG. 5 is a waveform diagram illustrating an operation of the voltage detection unit shown in FIG. 4.

Referring to FIG. 5, gate control signal Sg is alternately set to the off level and the on level in response to the turn-on/off instruction of semiconductor switching element 100. Pulse Pg is generated like one shot by pulse derivative unit 133 when gate control signal Sg makes transition from the off level to the on level.

A gate control signal Sg# is a signal indicating turn-on and turn-off of the semiconductor switching element (not shown) connected in series to semiconductor switching element 100 in FIG. 2 between the power supply lines to which main circuit power supply voltage VH is applied and paired with semiconductor switching element 100. Specifically, in inverter 40 in FIG. 1, gate control signals Sg and Sg# correspond to the control signals for turning on and off the semiconductor switching elements in the upper and lower arms of the same phase (such as arms 50-1 and 50-2), respectively. Therefore, gate control signal Sg# is set to the on level or the off level in a manner complementary to gate control signal Sg, on the premise that a dead time Td at which gate control signals Sg and Sg# are both set to the off level is ensured.

During a period in which gate control signal Sg# is at the on level and gate control signal Sg is at the off level, semiconductor switching element 100 in the turned-off state is connected between the power supply lines to which main circuit power supply voltage VH is applied. Therefore, inter-terminal voltage Vce of semiconductor switching element 100 during this period is equivalent to main circuit power supply voltage VH.

Therefore, by setting the time delayed by delay unit 131 shown in FIG. 4 to a time comparable to dead time Td, an inter-terminal voltage Vce# delayed by delay unit 131 is sampled in response to pulse Pg when semiconductor switching element 100 is turned on, so that inter-terminal voltage Vce during the period above, that is, main circuit power supply voltage VH, can be obtained.

As shown in FIG. 5, each time semiconductor switching element 100 is turned on, sample-and-hold unit 132 obtains main circuit power supply voltage VH and control target Vm of the surge voltage is set in accordance with obtained main circuit power supply voltage VH. Thus, following the change in main circuit power supply voltage VH, control target Vm of the surge voltage in active gate control at the turn-off of the semiconductor switching element can be changed.

In particular, according to the configuration in FIG. 4, as compared with an example where expensive insulating parts are necessary for obtaining main circuit power supply voltage VH from the outside of drive control unit 70, main circuit power supply voltage VH necessary for appropriately setting control target Vm of the surge voltage can be detected with inexpensive circuitry not requiring use of insulating parts, based on sampling of inter-terminal voltage Vce of semiconductor switching element 100.

Second Embodiment

In a second embodiment, active gate control allowing direct restriction of a voltage variation rate by setting a control target of the voltage variation rate representing a time-derivative value of inter-terminal voltage Vce of semiconductor switching element will be described.

Figure 6:
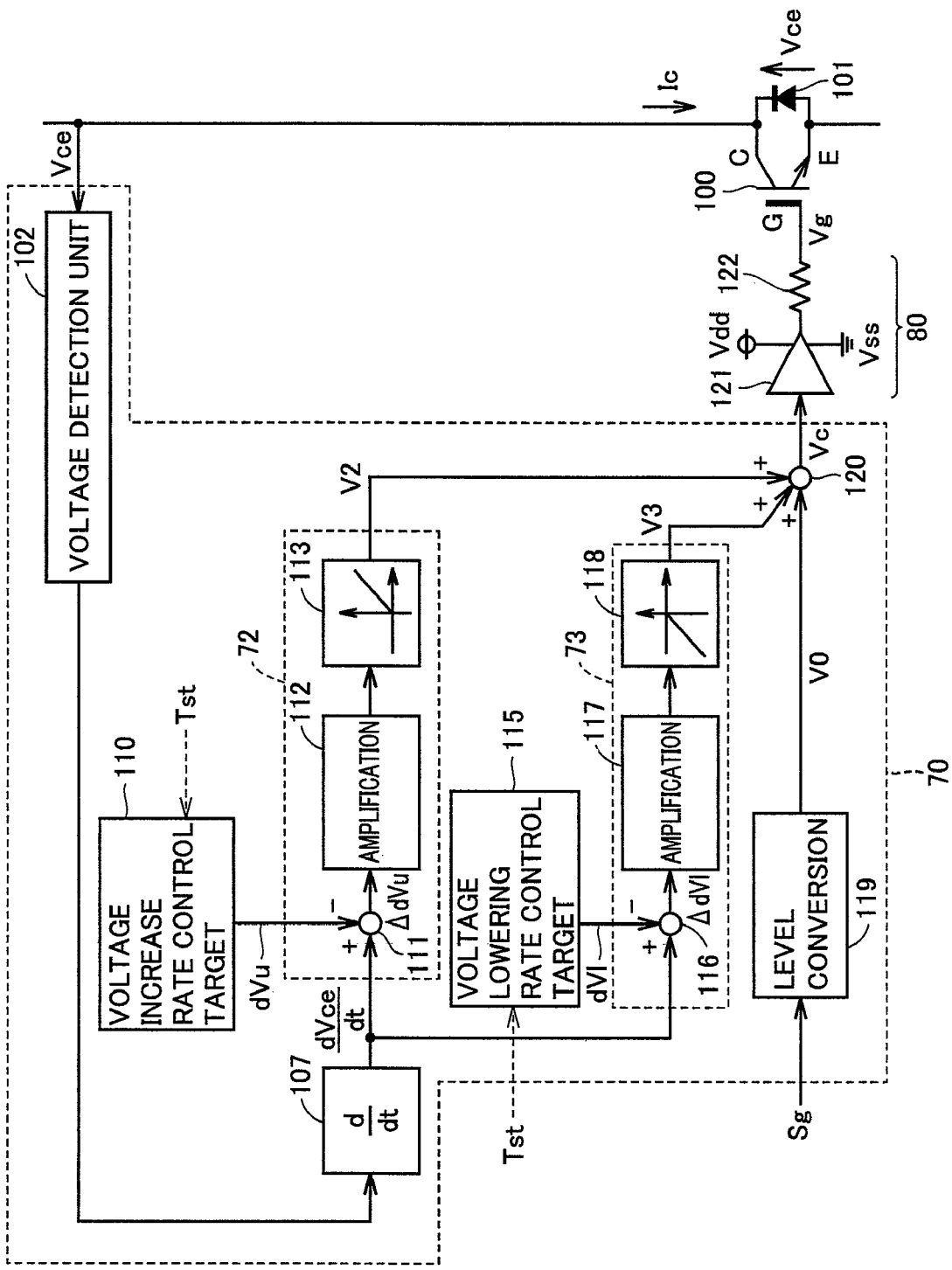
FIG. 6 is a block diagram illustrating a switching control configuration of each arm in a semiconductor power conversion device according to a second embodiment.

FIG. 6 is a block diagram illustrating a switching control configuration of each arm in a semiconductor power conversion device according to the second embodiment of the present invention.

Referring to FIG. 6, in the switching control configuration according to the second embodiment, drive control unit 70 includes a voltage derivative unit 107, a voltage increase rate control target setting unit 110 and an active gate control unit 72, and a voltage lowering rate control target setting unit 115 and an active gate control unit 73, instead of active gate control unit 71 in FIG. 1. Each component of voltage derivative unit 107 and active gate control units 72 and 73 may also be configured with any of hardware and software, as in the case of active gate control unit 71.

Voltage derivative unit 107 calculates a voltage variation rate dVce/dt representing a time-derivative value of inter-terminal voltage Vce detected by voltage detection unit 102.

Voltage increase rate control target setting unit 110 sets a control target dVu (>0) of voltage variation rate dVce/dt (>0) in voltage increase. Therefore, control target dVu corresponds to a voltage increase rate control target.

Similarly, voltage lowering rate target setting unit 115 sets a control target dVe (<0) of voltage variation rate dVce/dt (<0) in voltage lowering. Therefore, control target dVe corresponds to a voltage lowering rate control target. It is noted that each of voltage increase rate control target setting unit 110 and voltage lowering rate control target setting unit 115 corresponds to the "voltage variation rate control target setting unit" setting a control target of voltage variation rate dVce/dt.

Active gate control unit 72 includes a voltage operation unit 111, an amplifier unit 112, and a rectifier unit 113.

Voltage operation unit 111 calculates deviation ΔdVu of voltage variation rate dVce/dt calculated by voltage derivative unit 107 from voltage increase rate control target dVu (ΔdVu=dVce/dt−dVu). Amplifier unit 112 outputs a voltage obtained by amplifying deviation ΔdVu with prescribed control gain (amplification gain). Rectifier unit 113 calculates a quantity of voltage modification V2 by allowing passage only of a positive value of the output voltage from amplifier unit 112. Otherwise, that is, when the output from amplifier unit 112 is 0 or a negative voltage, setting as quantity of voltage modification V2=0 is made.

Therefore, when voltage variation rate dVce/dt in voltage increase exceeds control target dVu, quantity of voltage modification V2 by active gate control unit 72 is set only in a direction increasing gate voltage Vg of semiconductor switching element 100, that is, in a direction preventing turn-off of semiconductor switching element 100.

Similarly, active gate control unit 73 includes a voltage operation unit 116, an amplifier unit 117, and a rectifier unit 118.

Voltage operation unit 116 calculates deviation ΔdVl of voltage variation rate dVce/dt calculated by voltage derivative unit 107 from voltage lowering rate control target dVl (<0) (ΔdVl=dVce/dt−dVl). Amplifier unit 117 outputs a voltage obtained by amplifying deviation ΔdVu with prescribed control gain (amplification gain). Rectifier unit 118 calculates a quantity of voltage modification V3 by allowing passage only of a negative value of the output voltage from amplifier unit 112. Otherwise, that is, when the output from amplifier unit 112 is 0 or a positive voltage, setting as quantity of voltage modification V3=0 is made.

Therefore, when an absolute value of voltage variation rate dVce/dt (<0) in voltage lowering exceeds an absolute value of control target dVl (<0) (|dVce/dt|>|dVl|), quantity of voltage modification V3 by active gate control unit 73 is set only in a direction lowering gate voltage Vg of semiconductor switching element 100, that is, in a direction preventing turn-on of semiconductor switching element 100.

Then, voltage addition unit 120 generates control voltage Vc, in accordance with the sum of gate control voltage V0 output from level conversion unit 119, quantity of voltage modification V2 (V2>0) by active gate control unit 72, and quantity of voltage modification V3 (V3<0) by active gate control unit 73. Buffer circuit 121 drives gate voltage Vg of semiconductor switching element 100 in accordance with control voltage Vc.

Figure 7:
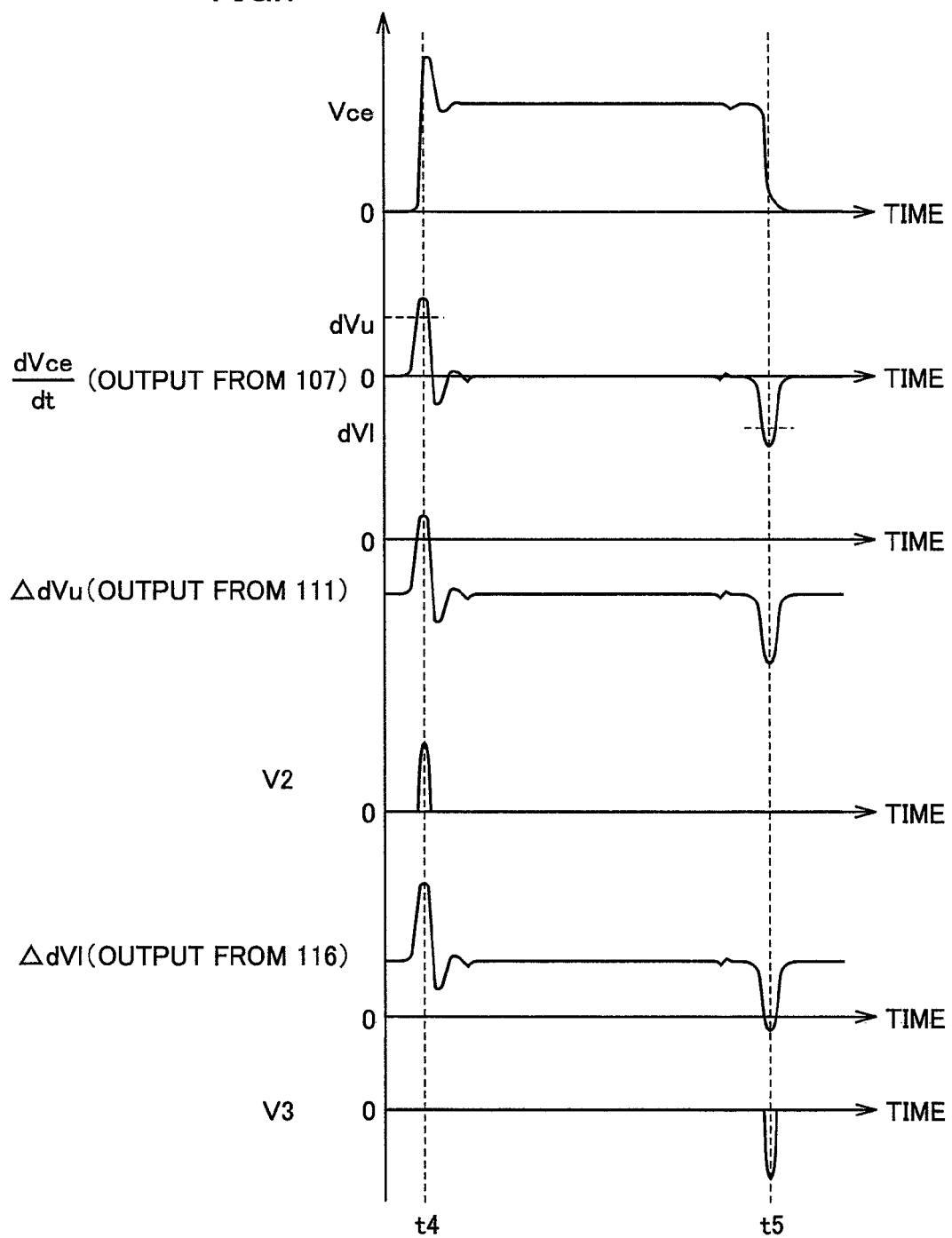
FIG. 7 is a waveform diagram illustrating an operation in active gate control in the semiconductor power conversion device according to the second embodiment.

FIG. 7 shows a waveform diagram illustrating an operation in active gate control in the semiconductor power conversion device according to the second embodiment.

Referring to FIG. 7, at the time of turn-off of semiconductor switching element 100 (around time t4), inter-terminal voltage Vce increases together with generation of a surge voltage, and accordingly voltage variation rate dVce/dt which is an output from voltage derivative unit 107 has a positive value. When voltage variation rate dVce/dt exceeds voltage increase rate control target dVu, deviation ΔdVu takes a positive value. Quantity of voltage modification V2 is set to V2>0 while voltage variation rate dVce/dt exceeds voltage increase rate control target dVu, and otherwise it is set to V2=0.

At the time of turn-off, significant lowering in inter-terminal voltage Vce does not take place. Therefore, normally, voltage variation rate dVce/dt is not lower than voltage lowering rate control target dVl. Namely, as relation of dVce/dt>dVl is satisfied, deviation ΔdVl always takes a positive value and quantity of voltage modification is fixed to V3=0.

Therefore, when semiconductor switching element 100 is turned off, quantity of voltage modification V2 is set in a direction increasing the gate voltage while voltage variation rate dVce/dt exceeds voltage increase rate control target dVu. Thus, active gate control for modifying gate voltage Vg in such a direction that control voltage Vc increases gate voltage Vg, that is, in a direction lowering a turn-off speed of semiconductor switching element 100 to lessen a rate of increase in inter-terminal voltage Vce is carried out.

On the other hand, at the time of turn-on of semiconductor switching element 100 (around time t5), inter-terminal voltage Vce lowers, and accordingly voltage variation rate dVce/dt which is an output from voltage derivative unit 107 has a negative value. While voltage variation rate dVce/dt (<0) is lower than voltage lowering rate control target dVl (<0), deviation ΔdVl takes a negative value. Quantity of voltage modification V3 is set to V3<0 while voltage variation rate dVce/dt is lower than voltage lowering rate control target dVl, and otherwise it is set to V3=0.

At the time of turn-on, significant increase in inter-terminal voltage Vce does not take place. Therefore, normally, voltage variation rate dVce/dt does not exceed voltage increase rate control target dVu. Namely, as relation of dVce/dt<dVu is satisfied, deviation ΔdVu always takes a negative value and quantity of voltage modification V2 is fixed to V2=0.

Therefore, when semiconductor switching element 100 is turned on, quantity of voltage modification V3 is set in a direction lowering the gate voltage while voltage variation rate dVce/dt is lower than voltage lowering rate control target dVl (|dVce/dt|>|dVl|). Thus, active gate control for modifying gate voltage Vg in such a direction that control voltage Vc lowers gate voltage Vg, that is, in a direction lowering a turn-on speed of semiconductor switching element 100 to lessen a rate of lowering in inter-terminal voltage Vce is carried out.

Thus, in the semiconductor power conversion device according to the second embodiment, the voltage variation rate (dv/dt) of inter-terminal voltage Vce is successively calculated, and when the voltage variation rate is out of the range from voltage increase rate control target dVu to voltage increase rate control target dVl, active gate control for modifying control voltage Vc, that is, gate voltage Vg, in a direction preventing variation of the current inter-terminal voltage can be carried out. Therefore, active gate control can directly be carried out such that the voltage variation rate (dv/dt) of inter-terminal voltage Vce is within a prescribed control target range.

Consequently, as the voltage variation rate of inter-terminal voltage Vce of semiconductor switching element 100 can directly be prevented from becoming excessive, prevention of occurrence of dielectric breakdown due to partial discharge between windings in motor 60 and measures against EMI by suppressing the voltage variation rate (dv/dt) can reliably be achieved.

Here, occurrence of partial discharge is dependent on an operation environment of motor 60. It has been known, in particular with regard to a temperature, a humidity (relative humidity) and air pressure, that partial discharge is more likely in such an environment as high temperature, high humidity and low air pressure (highland).

Therefore, motor measurement value Tst obtained by sensor 69 includes a temperature, a humidity (relative humidity) and an air pressure, so that motor measurement value Tst is transmitted to voltage increase rate control target setting unit 110 setting control target dVu and voltage lowering rate target setting unit 115 setting control target dVu as shown with a dotted line in FIG. 6. Then, at least one of control target dVu and control target dVl is preferably configured to be set variably in accordance with at least one of the temperature, the humidity (relative humidity) and the air pressure.

Specifically, in an operation environment where partial discharge is more likely such as high temperature, high humidity and low air pressure (use in highlands), setting should only be made such that the absolute values of control target dVu (>0) and control target dVl (<0) are relatively small. Namely, preferably, in an environment where partial discharge is more likely in motor 60, the range within which the voltage variation rate is limited is made stricter, while in an environment where partial discharge is less likely, the range within which the voltage variation rate is limited is relaxed. Thus, occurrence of dielectric breakdown due to partial discharge in motor 60 can be prevented without unduly increasing switching power loss in semiconductor switching element 100.

Figure 8:
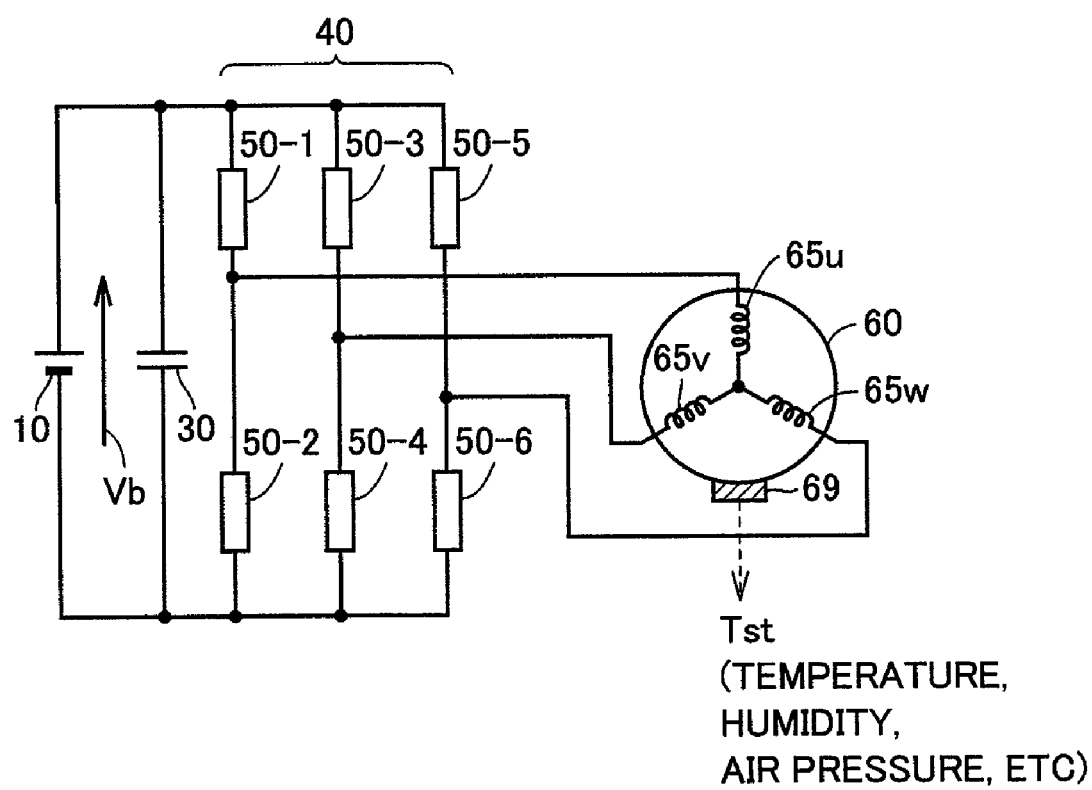
FIG. 8 is a circuit diagram showing an exemplary configuration of the semiconductor power conversion device to which active gate control according to the second embodiment of the present invention is applicable.

Unlike the configuration according to the first embodiment, the switching control configuration according to the second embodiment can control turn-on and turn-off of semiconductor switching element 100 so as to suppress the voltage variation rate of the inter-terminal voltage within a prescribed range, without obtaining information on main circuit power supply voltage VH. Therefore, the switching control configuration of each arm according to the second embodiment is applicable not only to inverter 40 in the configuration shown in FIG. 1 but also to a configuration where an input voltage to inverter 40 serving as a semiconductor power conversion device, that is, a main circuit power supply voltage, is constant, with converter 20 in the configuration in FIG. 1 being eliminated. Namely, active gate control according to the second embodiment is also applicable to a semiconductor switching element implementing a semiconductor power conversion device configured such that output voltage Vb from DC power supply 10 is provided to inverter 40 through smoothing capacitor 30 as a main circuit power supply voltage as shown in FIG. 8.

Variation of Second Embodiment

If active gate control according to the second embodiment is applied to inverter (semiconductor power conversion device) 40 applied to the configuration shown in FIG. 1, active gate control in the first embodiment may be combined with active gate control according to the second embodiment.

Figure 9:
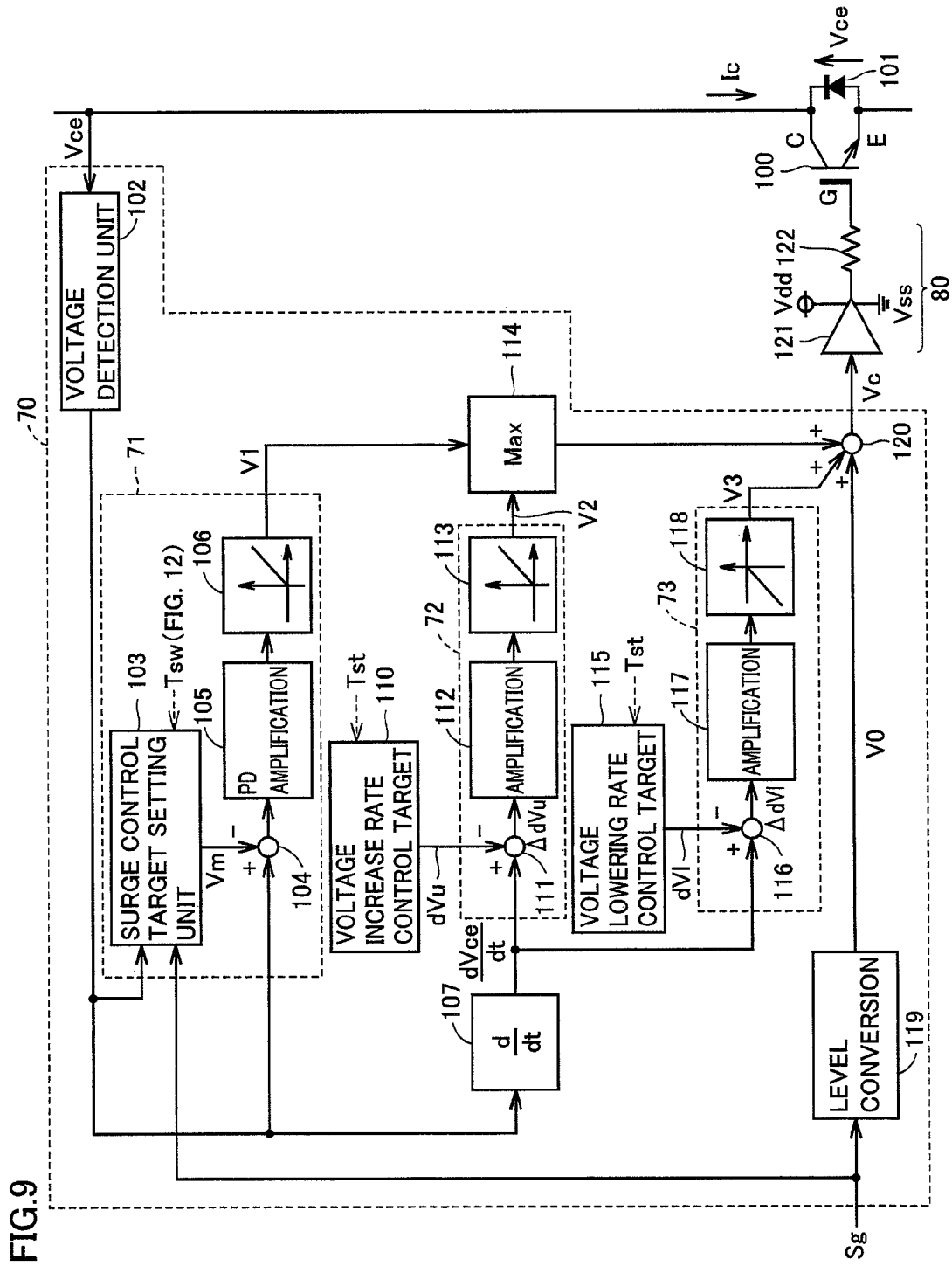
FIG. 9 is a block diagram illustrating a switching control configuration of each arm in a semiconductor power conversion device according to a variation of the second embodiment.

FIG. 9 is a block diagram illustrating a switching control configuration of each arm in a semiconductor power conversion device according to a variation of the second embodiment.

Referring to FIG. 9, the switching control configuration according to the variation of the second embodiment is configured such that drive control unit 70 further includes active gate control unit 71 similar to that in FIG. 1 and a maximum value setting unit 114, as compared with the switching control configuration in the second embodiment shown in FIG. 6. Maximum value setting unit 114 may also be configured with any of hardware and software.

Active gate control unit 71 sets quantity of voltage modification V1 in a direction increasing gate voltage Vg of semiconductor switching element 100, that is, a direction preventing turn-off of semiconductor switching element 100 while inter-terminal voltage Vce exceeds surge voltage control target Vm set in accordance with main circuit power supply voltage VH, as described in the first embodiment.

Maximum value setting unit 114 outputs a maximum value out of quantities of voltage modification V1 and V2 from respective active gate control units 71 and 72. Namely, maximum value setting unit 114 corresponds to an "adjustment unit".

Voltage addition unit 120 generates control voltage Vc in accordance with the sum of gate control voltage V0 output from level conversion unit 119, the maximum value (>0) out of quantities of voltage modification V1 and V2 output from maximum value setting unit 114, and quantity of voltage modification V3 (V3<0) by active gate control unit 73. Buffer circuit 121 drives gate voltage Vg of semiconductor switching element 100 in accordance with control voltage Vc.

According to such a configuration, the semiconductor power conversion device according to the variation of the second embodiment can carry out active gate control of the semiconductor switching element in such a manner as the first embodiment and the second embodiment being combined, so as to prevent any of increase in the surge voltage (inter-terminal voltage Vce) exceeding the control target corresponding to main circuit power supply voltage VH and occurrence of an excessive voltage variation rate out of a prescribed control target range.

Third Embodiment

Figure 10:
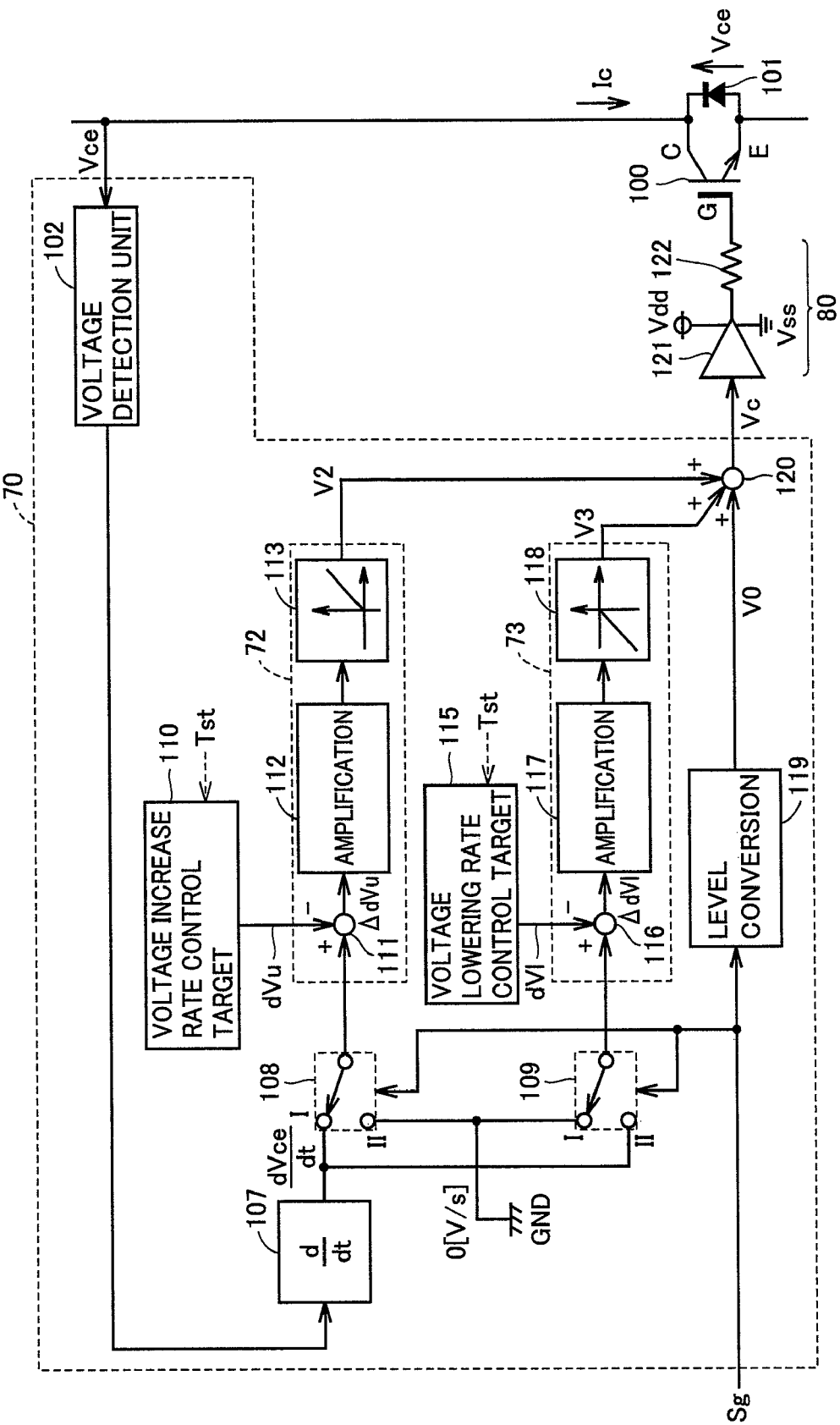
FIG. 10 is a block diagram illustrating a switching control configuration of each arm in a semiconductor power conversion device according to a third embodiment.

FIG. 10 is a block diagram illustrating a switching control configuration of each arm in a semiconductor power conversion device according to a third embodiment.

Referring to FIG. 10, the switching control configuration according to the third embodiment is provided such that drive control unit 70 further includes switches 108 and 109, as compared with the switching control configuration according to the second embodiment shown in FIG. 6. Switches 108 and 109 may also be configured with any of hardware and software.

Switch 108 switches an input to voltage operation unit 111 between voltage variation rate dVce/dt output from voltage derivative unit 107 and a ground level (GND). When voltage variation rate dVce/dt is input to voltage operation unit 111 through switch 108 (I side in FIG. 10), active gate control unit 72 generates quantity of voltage modification V2 through feedback control similar to that described in the second embodiment.

On the other hand, when the ground level (GND) is input to voltage operation unit 111 through switch 108 (II side in FIG. 10), this is equivalent to such a state that voltage variation rate dVce/dt is fixed to 0 and quantity of voltage modification V2 by active gate control unit 72 is fixed to 0. Namely, this state is equivalent to forced inactivation of active gate control unit 72.

Similarly, switch 109 switches an input to voltage operation unit 116 between voltage variation rate dVce/dt output from voltage derivative unit 107 and the ground level (GND).

Thus, active gate control unit 73 generates quantity of voltage modification V3 when voltage variation rate dVce/dt is input to voltage operation unit 116 through switch 109 (II side in FIG. 10) as in the second embodiment. On the other hand, when the ground level (GND) is input to voltage operation unit 116 through switch 108 (I side in FIG. 10), this is equivalent to forced inactivation and quantity of voltage modification is fixed to V3=0.

Switches 108 and 109 are controlled in accordance with a level of present gate control signal Sg.

Specifically, at the time of turn-off of semiconductor switching element 100 at which gate control signal Sg is set to the off level, sudden increase in the inter-terminal voltage at the time of turn-off is of concern, whereas necessity to address sudden voltage lowering is low. Therefore, switches 108 and 109 are controlled to the I side and active gate control unit 72 is activated so as to control the voltage increase rate of inter-terminal voltage Vce within the control target, while active gate control unit 73 is inactivated (fixed to V3=0). Thus, active gate control for restricting the voltage lowering rate which is not necessary at turn-off of semiconductor switching element 100 is stopped, and switching power loss involved therewith can be prevented.

On the other hand, at the time of turn-on of semiconductor switching element 100 at which gate control signal Sg is set to the on level, sudden lowering in the inter-terminal voltage is of concern at the time of turn-on, whereas necessity to address sudden voltage increase is low. Therefore, switches 108 and 109 are controlled to the II side and active gate control unit 73 is activated so as to control the voltage lowering rate of inter-terminal voltage Vce within the control target, while active gate control unit 72 is inactivated (fixed to V2=0). Thus, active gate control for restricting the voltage increase rate which is not necessary at turn-on of semiconductor switching element 100 is stopped, and switching power loss involved therewith can be prevented. Thus, switches 108 and 109 implement a "selection unit" selectively activating active gate control unit 72 at the time of turn-off and selectively activating active gate control unit 73 at the time of turn-on, in response to gate control signal Sg.

Configured as such, active gate control can be carried out so as to suppress increase in the voltage variation rate in an appropriate direction (increase or lowering) at the time of both turn-off and turn-on of semiconductor switching element 100. In particular, by selecting a direction of voltage variation to be restricted depending on turn-on and turn-off of the semiconductor switching element, active gate control for voltage variation in a direction low in necessity for suppression from the viewpoint of protection of an element is stopped, so that unnecessary increase in switching power loss can be avoided.

Variation of Third Embodiment

A switching control configuration according to the third embodiment is applicable to any of inverter (semiconductor power conversion device) 40 in FIG. 1 in which main circuit power supply voltage VH is variably controlled and inverter (semiconductor power conversion device) 40 in FIG. 8 in which main circuit power supply voltage VH is constant, as in the case of the configuration according to the second embodiment. In addition, as in the case of the configuration according to the second embodiment, when the switching control configuration according to the third embodiment is applied to inverter 40 in FIG. 1, the switching control configuration based on combination of active gate control in the first and third embodiments may be applicable.

Figure 11:
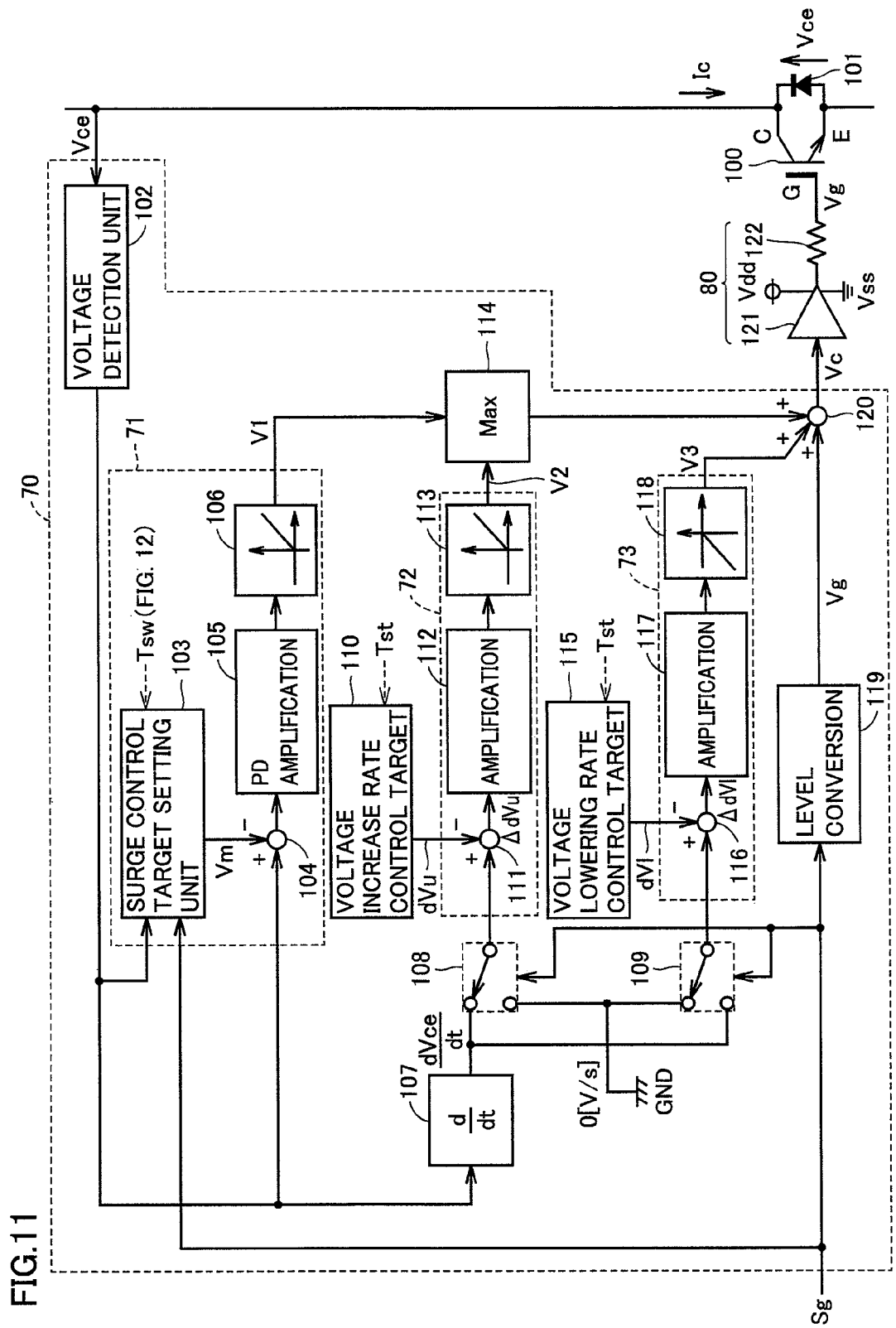
FIG. 11 is a block diagram illustrating a switching control configuration of each arm in a semiconductor power conversion device according to a variation of the third embodiment.

FIG. 11 is a block diagram illustrating a switching control configuration of each arm in a semiconductor power conversion device according to a variation of the third embodiment.

Referring to FIG. 11, in the switching control configuration according to the variation of the third embodiment, drive control unit 70 is configured to further include active gate control unit 71 similar to that in FIG. 1 and maximum value setting unit 114, as compared with the switching control configuration according to the third embodiment shown in FIG. 10.

As the operation of active gate control unit 71 has been described in the first embodiment and the operations of maximum value setting unit 114 and voltage addition unit 120 have also been described in the variation of the second embodiment, detailed description will not be repeated.

According to such a configuration, the semiconductor power conversion device according to the variation of the third embodiment can carry out active gate control of the semiconductor switching element based on combination of the first embodiment and the third embodiment, so as to not only achieve an effect in the third embodiment but also prevent such increase in the surge voltage (inter-terminal voltage Vce) as exceeding the control target corresponding to main circuit power supply voltage VH.

Fourth Embodiment

Figure 12:
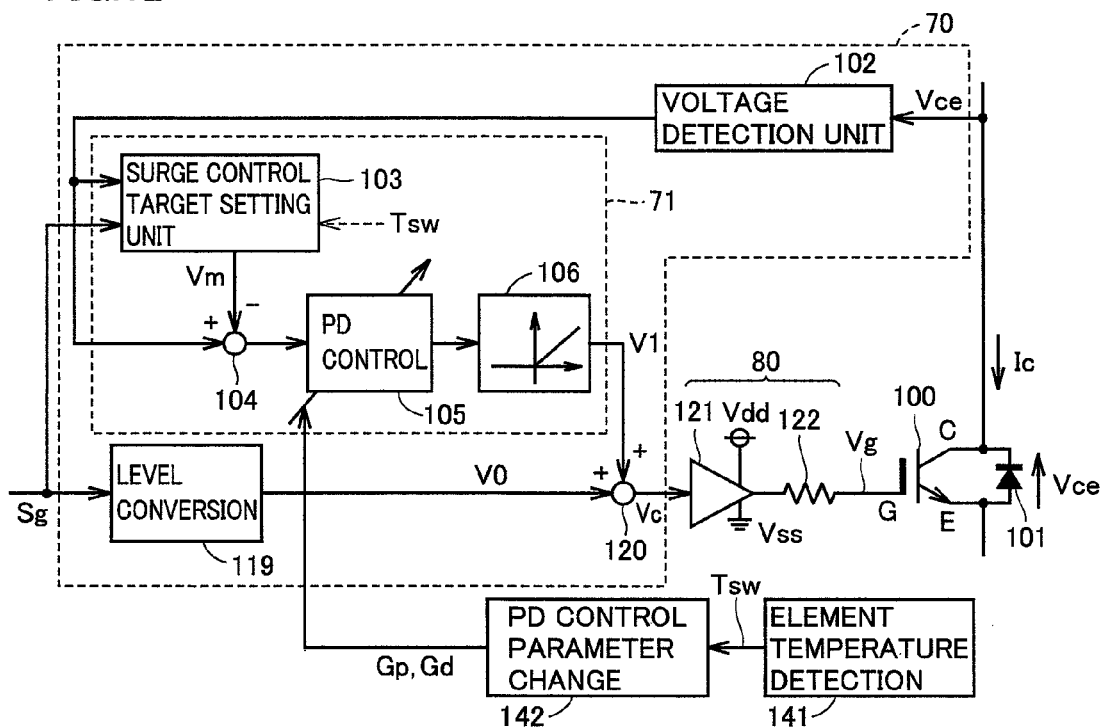
FIG. 12 is a block diagram illustrating a switching control configuration of each arm in a semiconductor power conversion device according to a fourth embodiment.

FIG. 12 is a block diagram illustrating a switching control configuration of each arm in a semiconductor power conversion device according to a fourth embodiment.

Referring to FIG. 12, in the switching control configuration according to the fourth embodiment, an element temperature detection unit 141 and a control parameter changing unit 142 are provided in addition to the switching control configuration according to the first embodiment shown in FIG. 2. Element temperature detection unit 141 and control parameter changing unit 142 may also be configured with any of hardware and software.

Element temperature detection unit 141 outputs an element temperature Tsw of semiconductor switching element 100, for example, based on a signal from a temperature sensor (not shown) incorporated in semiconductor switching element 100. Control parameter changing unit 142 variably sets control gain Gp and Gd in Equation (1) used for PD control operation in PD control unit 105, based on element temperature Tsw from element temperature detection unit 141. As the configuration and the operation of other portions in the switching control configuration shown in FIG. 12 are the same as those shown in FIG. 2, description thereof will not be repeated.

Figure 13:
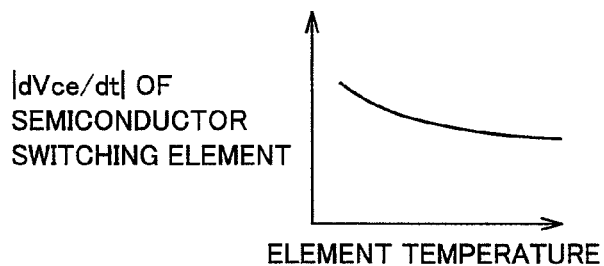
FIG. 13 is a conceptual diagram illustrating a temperature characteristic of a voltage variation rate of a semiconductor switching element.

As shown in FIG. 13, when a condition other than the element temperature is the same, the absolute value of voltage variation rate dVce/dt of the inter-terminal voltage of semiconductor switching element 100 becomes smaller with increase in element temperature Tsw and it becomes greater with decrease in element temperature Tsw. Namely, when the temperature is low, the voltage variation rate is relatively great and the surge voltage tends to be higher.

Figure 14:
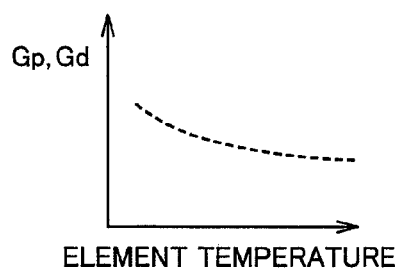
FIG. 14 is a conceptual diagram illustrating setting of control gain in a switching control configuration of each arm in the semiconductor power conversion device according to the fourth embodiment.

Accordingly, as shown in FIG. 14, by changing control gain Gp, Gd in accordance with element temperature Tsw, feedback control gain through active gate control is relatively increased when the temperature is low and relatively decreased when the temperature is high.

According to such a configuration, when the temperature is low, a quantity of gate voltage modification by active gate control with respect to variation of inter-terminal voltage Vce is made relatively larger, to thereby prevent occurrence of excessive voltage variation. On the other hand, in such a state that the temperature is high where the response of the semiconductor switching element is low and voltage variation is relatively gentle, a quantity of gate voltage modification by active gate control is relatively made smaller, so that increase in switching power loss in the semiconductor switching element due to excessive control can be prevented.

Control gain in PD control unit 105 has been described by way of example of the control parameter to be changed by element temperature detection unit 141 and control parameter changing unit 142, and other control parameters relating to active gate control may also be set variably in accordance with the element temperature of the semiconductor switching element. For example, an effect the same as above can be obtained by setting amplification gain in amplifier unit 112, 117 described in the second embodiment (FIG. 6) or the like to a relatively small value when the temperature is high and setting the same to a relatively large value when the temperature is high, as described in connection with FIG. 14.

Alternatively, regarding a configuration for transmitting element temperature Tsw to surge control target setting unit 103 as shown with the dotted line in FIG. 2 or the like, surge voltage control target Vm may also be set variably in accordance with the element temperature of the semiconductor switching element. Specifically, in such a state that the temperature is low where voltage variation (dVce/dt) is great, surge voltage control target Vm is set to a relatively low value, so that an excessive surge voltage when the temperature is low can effectively be prevented and increase in switching power loss caused by excessive active gate control when the temperature is high can be prevented.

Thus, the switching control configuration according to the fourth embodiment may be combined as appropriate with the configuration in the first to third embodiments for application to any of inverter (semiconductor power conversion device) 40 in FIG. 1 in which main circuit power supply voltage VH is variably controlled and inverter (semiconductor power conversion device) 40 in FIG. 8 in which main circuit power supply voltage VH is constant.

In the present embodiment described above, an inverter driving and controlling a motor has been illustrated as the semiconductor power conversion device according to the present invention, however, application of the present invention is not limited thereto. Namely, the present invention is applicable to switching control of a semiconductor power conversion device configured to include a semiconductor switching element carrying out what is called hard switching, such as a DC/DC converter, a boost chopper, a switching mode amplifier, and the like.

In addition, regarding the semiconductor switching element as well, an IGBT has been illustrated in the present embodiment, however, the switching control configuration according to the present invention is applicable also to another voltage-driven-type switching element such as a power MOS (Metal Oxide Semiconductor) transistor. In addition, the switching control configuration according to the present invention is also applicable to a semiconductor power conversion device implemented by a current-driven-type switching element such as a power bipolar transistor, by configuring buffer circuit 121 in drive circuit 80 (FIG. 2 or the like) such that a drive current in accordance with control voltage Vc is supplied to a control electrode (base).

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

As described above, the present invention can be utilized in switching control of a semiconductor power conversion device configured to include a semiconductor switching element carrying out what is called hard switching, such as a DC/DC converter, a boost chopper, a switching mode amplifier, and the like.

The invention claimed is:

1. A semiconductor power conversion device converting a variably controlled main circuit power supply voltage, comprising:
   a semiconductor switching element controlling a current between first and second electrodes in response to a voltage or current of a control electrode;
   a drive control unit for setting a control voltage within a range from a first voltage for rendering said semiconductor switching element conducting to a second voltage for disconnecting said semiconductor switching element, in accordance with a control signal indicating turn-on and turn-off of said semiconductor switching element; and
   a drive circuit for driving said voltage or current of said control electrode in accordance with said control voltage set by said drive control unit,
   said drive control unit including
   a voltage detection unit for detecting an inter-electrode voltage across said first and second electrodes,
   a surge control target setting unit for variably setting in accordance with said main circuit power supply voltage, a control target of a surge voltage generated across said first and second electrodes when said semiconductor switching element is turned off, and
   a first active gate control unit for modifying said control voltage toward said first voltage by a quantity of voltage modification based on said inter-electrode voltage, when said inter-electrode voltage detected by said voltage detection unit exceeds said control target.

2. The semiconductor power conversion device according to claim 1, wherein
   said first active gate control unit performs control operation based on deviation of said inter-electrode voltage from said control target, and sets said quantity of voltage modification in accordance with a control operation result when said control operation result indicates a positive value, whereas sets said quantity of voltage modification to substantially zero when said control operation result indicates a negative value.

3. The semiconductor power conversion device according to claim 2, wherein
   said first active gate control unit performs said control operation under proportional-derivative control.

4. The semiconductor power conversion device according to claim 1, wherein
   said surge control target setting unit sets said control target based on a voltage detected by said voltage detection unit in a period during which said semiconductor switching element is turned off and is electrically connected between power supply lines to which said main circuit power supply voltage is applied.

5. The semiconductor power conversion device according to claim 1, wherein
   said drive control unit further includes a voltage increase rate control target setting unit for setting a control target of a voltage increase rate representing a time-derivative value in increase in said inter-electrode voltage, a second active gate control unit for modifying said control voltage toward said first voltage by a quantity of voltage modification in accordance with deviation of said voltage increase rate from said control target based on said inter-electrode voltage detected by said voltage detection unit, when said voltage increase rate exceeds said control target, and an adjustment unit for modifying said control voltage toward said first voltage by a larger voltage quantity out of the quantities of voltage modification by said first and said second active gate control units.

6. The semiconductor power conversion device according to claim 5, wherein
said drive control unit further includes
a voltage lowering rate control target setting unit for setting a control target of a voltage lowering rate representing a time-derivative value in lowering in said inter-electrode voltage, and
a third active gate control unit for modifying said control voltage toward said second voltage by a quantity of voltage modification in accordance with deviation of said voltage lowering rate from said control target based on said inter-electrode voltage detected by said voltage detection unit, when said voltage lowering rate exceeds said control target.

7. The semiconductor power conversion device according to claim 6, wherein
said drive control unit further includes a selection unit for selectively activating one of said second and said third active gate control units in accordance with said control signal, and
said selection unit activates said second active gate control unit when said semiconductor switching element is turned off, and said selection unit activates said third active gate control unit when said semiconductor switching element is turned on.

8. The semiconductor power conversion device according to claim 6, wherein
at least one of said voltage increase rate control target setting unit and said voltage lowering rate control target setting unit variably sets said control target based on at least one of a temperature, an air pressure and a relative humidity of a motor driven and controlled by said semiconductor power conversion device.

9. The semiconductor power conversion device according to claim 6, further comprising:
a temperature detection unit for detecting a temperature of said semiconductor switching element; and
a control parameter changing unit for variably setting a control parameter used for control operation for calculating a quantity of voltage modification of said control voltage in at least one of said third active gate control units, in accordance with an element temperature detected by said temperature detection unit.

10. The semiconductor power conversion device according to claim 5, wherein
said voltage increase rate control target setting unit variably sets said control target based on at least one of a temperature, an air pressure and a relative humidity of a motor driven and controlled by said semiconductor power conversion device.

11. The semiconductor power conversion device according to claim 5, further comprising:
a temperature detection unit for detecting a temperature of said semiconductor switching element; and
a control parameter for changing unit for variably setting a control parameter used for control operation for calculating a quantity of voltage modification of said control voltage in at least one of said first and said second active gate control unites, in accordance with an element temperature detected by said temperature detection unit temperature detection unit.

12. The semiconductor power conversion device according to claim 1, wherein
said drive control unit further includes
a voltage lowering rate control target setting unit for setting a control target of a voltage lowering rate representing a time-derivative value in lowering in said inter-electrode voltage, and
a third active gate control unit for modifying said control voltage toward said second voltage by a quantity of voltage modification in accordance with deviation of said voltage lowering rate from said control target based on said inter-electrode voltage detected by said voltage detection unit, when said voltage lowering rate exceeds said control target.

13. The semiconductor power conversion device according to claim 12, wherein
said voltage lowering rate control target setting unit variably sets said control target based on at least one of a temperature, an air pressure and a relative humidity of a motor driven and controlled by said semiconductor power conversion device.

14. The semiconductor power conversion device according to claim 12, further comprising:
a temperature detection unit for detecting a temperature of said semiconductor switching element; and
a control parameter changing unit for variably setting a control parameter used for control operation for calculating a quantity of voltage modification of said control voltage in at least one of said first and said third active gate control units, in accordance with an element temperature detected by said temperature detection unit.

15. The semiconductor power conversion device according to claim 1, further comprising:
a temperature detection unit for detecting a temperature of said semiconductor switching element; and
a control parameter changing unit for variably setting a control parameter used for control operation for calculating a quantity of voltage modification of said control voltage in said first active gate control unit, in accordance with an element temperature detected by said temperature detection unit.

* * * * *